United States Patent [19]
Ross

[11] Patent Number: 4,540,950
[45] Date of Patent: Sep. 10, 1985

[54] WIDEBAND LINEAR AMPLIFIER

[75] Inventor: David G. Ross, Fair Haven, N.J.

[73] Assignee: AT&T Bell Laboratories, Murray Hill, N.J.

[21] Appl. No.: 385,557

[22] Filed: Jun. 7, 1982

[51] Int. Cl.³ .............................................. H03F 3/30
[52] U.S. Cl. .................................. 330/267; 330/299;
                                                            330/311
[58] Field of Search ............... 330/263, 265, 266, 267,
                                                      330/299, 310, 311

[56] References Cited

U.S. PATENT DOCUMENTS 3,418,589 12/1968 Yee ...................................... 330/267
4,406,990 9/1983 Noro ................................ 330/267 X

FOREIGN PATENT DOCUMENTS 2032682 1/1972 Fed. Rep. of Germany ...... 330/267

OTHER PUBLICATIONS

*The Bell System Tech. Jour.*, vol. 57, No. 7, Sep. 1978, "SG Undersea Cable System: Repeater and Equalizer Design and Manufacture", by C. D. Anderson et al., pp. 2355–2403 (esp. pp. 2365–2367 and FIG. 7).

*Primary Examiner*—James B. Mullins
*Attorney, Agent, or Firm*—Richard B. Havill

[57] ABSTRACT

A linear amplifier circuit includes input and output signal ports and a pair of signal amplifying circuits. Each signal amplifying circuit couples an input signal from the input signal port to the output signal port. A bias supply can be connected to the signal amplifying circuits for supplying bias currents thereto. The input and output signal ports are isolated from the bias supply without using capacitors or inductors.

5 Claims, 5 Drawing Figures

WIDEBAND LINEAR AMPLIFIER

The invention relates to a wideband linear amplifier and more particularly to an integrable wideband linear amplifier.

BACKGROUND OF THE INVENTION

A lightguide pulse transmission system uses wideband repeaters for regenerating signals to overcome pulse attenuation that occurs in the lightguide. Because system signal levels vary as a result of component age and ambient temperature changes, it is helpful to use automatic gain control in the repeaters. The operating frequency of the lightguide system is so high that designing a linear amplifier with automatic gain control presents many problems. One problem is the design of a controllable integrated circuit with a smooth characteristic over a very wide frequency range.

SUMMARY OF THE INVENTION

This problem is solved by a linear amplifier circuit including input and output signal ports and a pair of signal amplifying circuits. Each signal amplifying circuit couples an input signal from the input signal port to the output signal port. Means are provided for connecting a bias supply to the signal amplifying circuits for supplying bias currents thereto. The signal ports are isolated from the bias supply without using capacitors or inductors.

BRIEF DESCRIPTION OF THE DRAWING

A better understanding of the circuit may be derived by reading the following description with reference to the attached drawings wherein.

DETAILED DESCRIPTION

Figure 1:
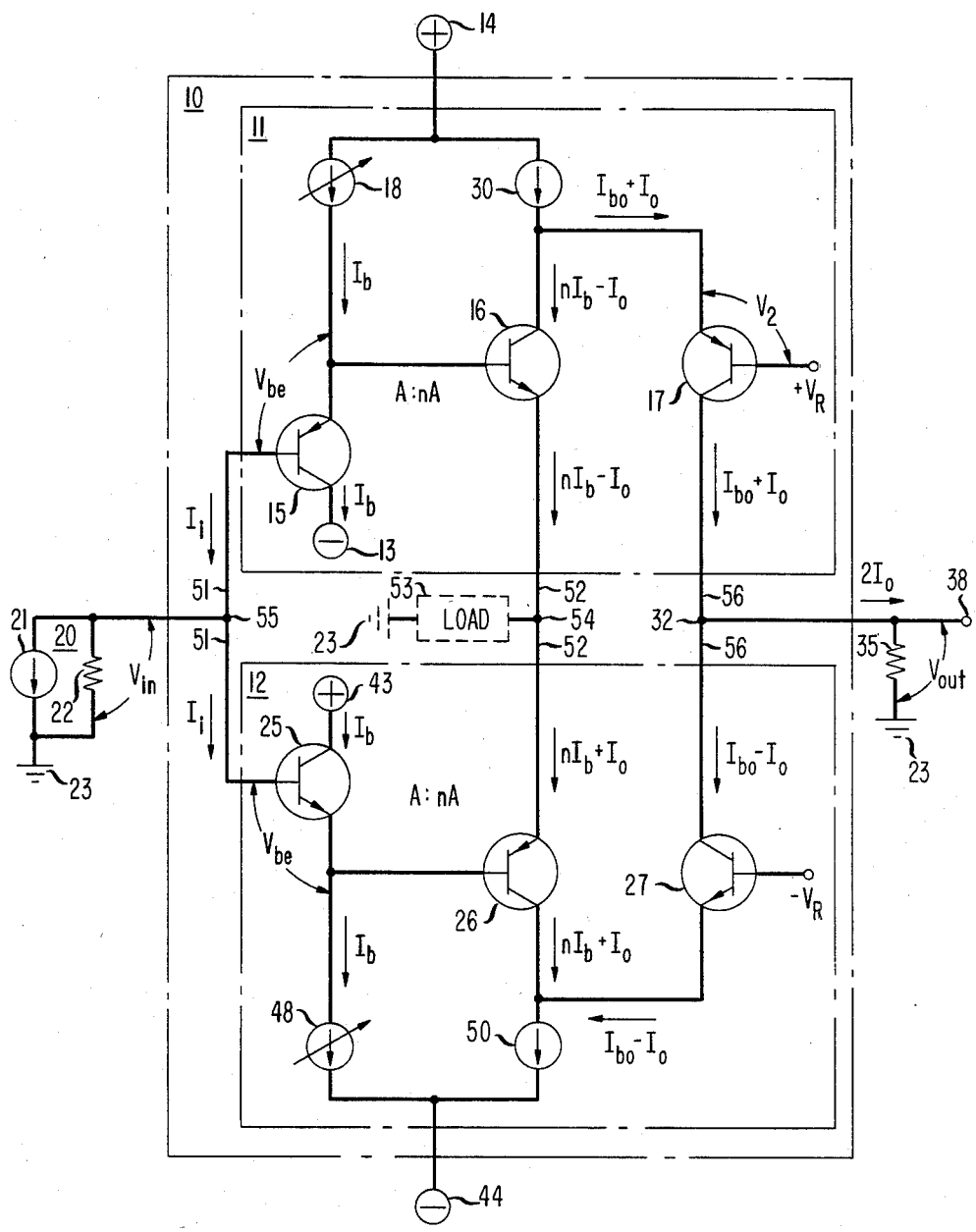
FIG. 1 is a schematic diagram of a circuit in accordance with the invention.

Referring now to FIG. 1, there is shown a linear amplifier circuit 10 which can be fabricated advantageously as a monolithic integrated circuit. The linear amplifier circuit 10 includes a pair of signal amplifying circuits 11 and 12. Signal amplifying circuit 11 includes three bipolar transistors 15, 16 and 17, the transistor 16 being of opposite conductivity type from the transistors 15 and 17. Signal amplifying circuit 12 also includes three bipolar transistors 25, 26 and 27, each of which is of opposite conductivity type from its respective counterpart transistor 15, 16 or 17 in the signal amplifying circuit 11. The devices 15, 16, 17, 25, 26 and 27 may have any of a wide range of operating characteristics. They may be very fast devices operating in the microwave frequency range, for instance in a lightguide pulse transmission system. For another application operating in a lower frequency range, the devices can be either the mentioned very fast devices or slower speed devices.

With the very fast devices, the circuit 10 may be used either as a fixed amplifier or as a controlled-gain circuit in a high capacity transmission system, such as the previously mentioned lightguide pulse transmission system. This system may be either a short or long length system.

For purposes of simplifying the understanding of the arrangement and operation of the circuit 10, the circuits 11 and 12 will be described separately with respect to similar circuits shown respectively in FIGS. 2 and 3. Thereafter the combination of the circuits 11 and 12 in the linear amplifier circuit 10 of FIG. 1 is described further with respect to its arrangement and operation.

Figure 2:
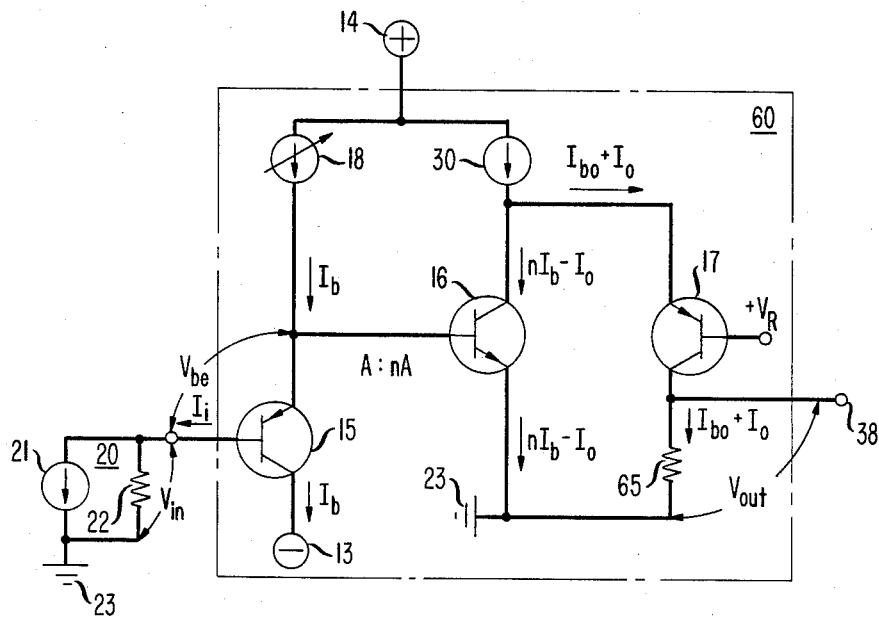
FIG. 2 is a schematic diagram of a portion of the circuit shown in FIG. 1.

Referring now to FIG. 2, there is shown a signal amplifying circuit 60 which is similar to the signal amplifying circuit 11 of FIG. 1 except that it is not interconnected with its counterpart circuit 12. An output load 65 is connected between the collector of the output transistor 17 and a ground reference 23.

In the signal amplifying circuit 60, the PNP input transistor 15 is arranged in a common-collector configuration and is biased to operate in its normal forward-biased range. A negative polarity bias source 13 is connected directly to the collector electrode of the input transistor 15. A positive polarity bias source 14 is connected through a bias current source 18 to the output emitter electrode of the transistor 15. The source 18 can be either a fixed current source or the variable current source shown in FIG. 1. The current source 18 is interposed in the emitter circuit of the input transistor 15 for supplying the bias current $I_b$ in the emitter-collector path of the input transistor. The load, connected directly to the emitter electrode of the input transistor, is the base-emitter input circuit of the transistor 16.

The bias current $I_b$ for the PNP transistor 15 is conducted from the positive supply 14 through the bias current source 18 and the emitter-collector path of the transistor 15 to the negative source 13. Since the load for the transistor 15 is the base-emitter circuit of the transistor 16, the bias current to this load is small and may be neglected for purposes of this description.

Input transistor 15 is operated as a voltage follower, wherein an input signal source 20 connected to the input base electrode supplies an input signal voltage $V_{in}$ to the base electrode. Thus the base of the transistor 15 receives input signals applied to the circuit 60. Input signal source 20 includes an input signal current source 21 which is shunted by a resistor 22 in a parallel combination that is connected between the ground reference 23 and the base electrode of the transistor 15. Input offset, resulting from the base current of the transistor 15 being conducted through the resistor 22, is small and may be neglected for purposes of this description.

In operation the voltage follower arrangement of the transistor 15 responds to the input signal voltage $V_{in}$ that is produced by the source 20 and applied to the base electrode of the transistor 15. A small emitter signal current is conducted through the emitter-collector path. This current, which also is conducted through the base-emitter junction of the transistor 16, is negligibly small.

The input impedance of the signal amplifying circuit 11 is the same as that of the transistor 15. For the common-collector configuration of the transistor 15, the input impedance is high and is approximately equal to the beta of the transistor 15 times the input impedance of the loading common-emitter transistor 16.

A parasitic collector junction capacitance which exists between the base and collector electrodes of the transistor 15 has minimal effect on the broadband linear characteristic of the circuit 11. Such parasitic capacitance appears between the input node at the base of the transistor 15 and the common node at the reference potential 13. There is no effective multiplication of the capacitance as current conducted through the load impedance varies.

The NPN transistor 16 in circuit 11 is arranged in a common-emitter configuration and is biased to operate in its normal forward-biased range. The emitter electrode of the transistor 16 is connected directly to the ground reference 23. Positive polarity bias source 14 is connected through a bias current source 30 to the output collector electrode of the transistor 16. The transistor 17 and a resistor 65 are connected as a load on the output of the transistor 16 between the collector electrode of the transistor 16 and the ground reference 23.

Bias current $nI_b$ for the NPN transistor 16 is conducted from the positive source 14 through the bias current source 30 and the collector-emitter path of the transistor 16 to the ground reference 23.

Because the input transistor 15 operates as a voltage follower, the input signal voltage $V_{in}$ applied by the source 20 appears at the emitter of the transistor 15 and across the base-emitter junction of the transistor 16. For both bias and signal, the voltages across the base-emitter junctions of the transistors 15 and 16 are substantially identical because the emitter of the transistor 15 is connected to the base of the transistor 16 and because both the base of the transistor 15 and the emitter of the transistor 16 are referenced to the ground reference 23. The voltages differ only by the voltage across the source resistance 22, which previously was described as small.

In operation the voltage drop across the base-emitter junction of the transistor 16 controls the amplitude of the output signal current $I_o$ conducted through the collector-emitter path of the transistor 16. The base-emitter junction voltage is determined by the bias current $I_b$ conducted through the transistor 15 and supplied by the source 18. The signal current $I_o$ is conducted from the transistor 16 to the emitter input electrode of the transistor 17. A signal voltage is produced across the base-emitter junction of the transistor 17 by the signal current $I_o$ being conducted through that junction.

The PNP output transistor 117 is arranged in a common-base configuration and is biased to operate in its normal forward-biased range. As just mentioned, its emitter input electrode is connected with the collector output electrode of the transistor 16 and with the bias current source 30. The collector electrode of the transistor 17 is connected through a load transistor 65 to the ground reference 23. Output signals are transmitted from the circuit 60 by way of a terminal 38 that is connected to the collector of the transistor 17.

The transistors 16 and 17 are arranged in a cascode circuit configuration.

Bias current $I_{bo}$ for the PNP output transistor 17 is conducted from the positive source 14 through the bias current source 30, the emitter-collector path of the transistor 17, and the resistor 65 to the ground reference 23. It is noted that the same bias voltage is applied to two parallel branch circuits which include, respectively, the collector-emitter paths of the transistors 16 and 17 of the cascode circuit configuration. By arranging the circuit with the parallel branch circuits for the bias currents, a low bias voltage can be used. The magnitude of the bias voltage between the source 14 and the ground reference 23 is less than the magnitude of bias voltage used in prior series cascode circuit configurations.

It is a useful property of the common-base connection of the transistor 17 that an output current to input current ratio, $\alpha$, is nearly unity over a wide frequency band and over a very broad range of bias currents. Thus the output signal current from the transistor 17 is substantially the same magnitude as the output signal current $I_o$ from the transistor 16 and is given the same designator. The magnitude of the output signal current $I_o$ of the transistor 17 is strongly dependent upon the magnitude of the bias current $nI_b$ and is nearly independent of the magnitude of the bias current $I_{bo}$. Therefore it is possible to control the output signal current $I_o$ from the transistor 17 by controlling the bias current $nI_b$ which is determined by the bias current $I_b$.

In a prior art cascode arrangement using transistors of like conductivity types, any variation of the bias current in the common-emitter transistor would also vary the current drawn from the bias supply. In the circuit of FIG. 2, however, the current drawn from the source 14 by the current source 30 remains constant. Any increase or decrease in the bias current $nI_b$ is balanced by an offsetting decrease or increase in the bias current $I_{bo}$. Thus circuit gain can be controlled while maintaining a constant supply current and minimizing regulation requirements on the source 14, especially in long repeatered transmission systems such as the mentioned undersea lightguide transmission system which is powered from an on-shore constant-current generator.

As previously mentioned, the transistors 16 and 17 are connected in a cascode circuit arrangement. Transistor 17, which is arranged in a common-base configuration, is the load for the common-emitter configuration of the transistor 16. The common-base configuration of the transistor 17 is an advantageous load for the transistor 16 because the common-base configuration has a low input impedance. This low impedance, connected as a load at the collector of the transistor 16, helps reduce the Miller effect which otherwise would occur in the common-emitter configuration of the transistor 16.

Previously it was known that a transistor arranged in a common-emitter configuration produces an output signal voltage subject to possible distortion resulting from the Miller effect. The Miller effect is caused by and is proportional to any signal voltage difference between the base and collector of that transistor. This signal voltage difference can cause an undesirable current, proportional to the signal voltage difference, to be conducted in a parasitic capacitance between the base and collector electrodes. At high frequencies when the capacitive impedance is low, the Miller effect current is especially problematical. Such undesirable current can be reduced by minimizing the signal voltage difference between the base and the collector of the transistor.

For any wideband application, minimization of the base-collector voltage for the transistor 16 is accomplished by making the source and load impedances of the transistor 16 very low values. The emitter-follower stage of the transistor 15 presents a low source impedance. The load presented to the output of the transistor 16 is the input impedance of the transistor 17 which also is a low value.

The low input impedance to the transistor 17 can be approximated by two impedance parts connected in a series circuit. One part is the input impedance of the emitter-base junction, which is proportional to $$\frac{KT}{qI_{be}},$$

wherein K is Boltzman's constant, T is absolute temperature, q is the charge on an electron, and $I_{be}$ is the base-emitter current. The other part of the input impedance is the impedance of the base circuit, which is proportional to $$\frac{R_b}{\beta},$$

wherein $R_b$ is the base resistance and $\beta$ is the current gain of the transistor 12, a large number.

These low input and output impedances maintain low amplitude voltages at both the base input and the collector output electrodes of the transistor 16. Because the base and collector voltages are low, there is very little signal voltage difference between the base and collector and only a small current is conducted through the parasitic collector-base capacitance of the transistor 16. This small current is designed to have a low enough amplitude to avoid any substantial distortion of the signal at the collector of the transistor 16.

Because of its common-base configuration, the output impedance of the transistor 17 is a very high value which varies somewhat over a wide range of frequencies. For low frequencies, the output impedance is determined by the impedance of the collector-base junction. A typical low frequency output impedance is in the hundreds of kilohms. For high frequencies, the output impedance is determined by the impedance of a parasitic collector-base capacitance. The overall high output impedance of the circuit 60 results in negligible loss of current into the load 65 over a range of frequencies that may extend to several hundreds of megahertz. Within this range of frequencies the load impedance may have a moderate magnitude typically found in wideband repeater circuits.

An output voltage $V_{out}$ is developed across the load impedance 65 and is not subjected to any Miller effect because the parasitic collector-base junction capacitance of the transistor 17 does not couple the input signal $V_2$ on the emitter of that transistor to the output on the terminal 38. The output voltage $V_{out}$ is a product of the impedance of the load 65 and the output signal current $I_o$, which is conducted through the load 65.

Amplitude of an output signal $I_o$ from the transistor 16 is determined by the bias current $I_b$ of the transistor 15 for the following reasons. The current $I_o$ is equal to the input signal voltage $V_{in}$, as applied to the transistor 16, times its transconductance $g_m$, which is defined as $$g_m = \frac{qI}{KT}.$$

In this expression, q is the charge on an electron, K is Boltzman's constant and T is absolute temperature. The current $I = nI_b - I_o$ and is the total emitter current of the transistor 16. The total emitter current is related to the base-emitter voltage $V_{be16}$ of the transistor 16 by a well-known equation $$V_{be} = \frac{KT}{q} \ln \frac{I}{I_{s16}},$$

where $I_{s16}$ is the saturation current of the transistor 16. From this expression, the total emitter current $$I = I_{s16} \exp\left(\frac{qV_{be16}}{KT}\right).$$

In accordance with that same equation, the voltage $V_{be16}$ is determined by the current conducted through the transistor 15 and supplied by the source 18. Thus the base-emitter voltage $$V_{be16} = V_{be15} = \frac{KT}{q} \ln \frac{I_b}{I_{s15}}.$$

By substituting the latter into the expression for the total emitter current I, the current $$I = I_b \cdot \frac{I_{s16}}{I_{s15}}.$$

As a result the output signal current $$I_o = g_m v_{in} = V_{in} \cdot q \frac{I_b}{KT} \cdot \frac{I_{s16}}{I_{s15}},$$

where $I_{s16}$ and $I_{s15}$ are the saturation currents of the transistors 16 and 15, respectively.

The emitter areas of the transistors 15 and 16 may be the same as or different from one another. As shown symbolically in FIG. 2, the cross-sectional emitter area of the transistor 15 is an area A and of the transistor 16 an area nA. With the emitter area of the transistor 16 equal to n times the emitter area of the transistor 15, the magnitude of the saturation current $I_{s16}$ is n times the magnitude of the saturation current $I_{s15}$, as long as other factors are equal. It follows that the output signal current $$I_o = V_{in} \cdot \frac{qI_b}{KT} \cdot n.$$

Transconductance of the transistor 16 therefore is determined by the bias current $I_b$ and the ratio of emitter areas. In a preferred embodiment, the ratio of emitter areas n is greater than one.

Figure 4:
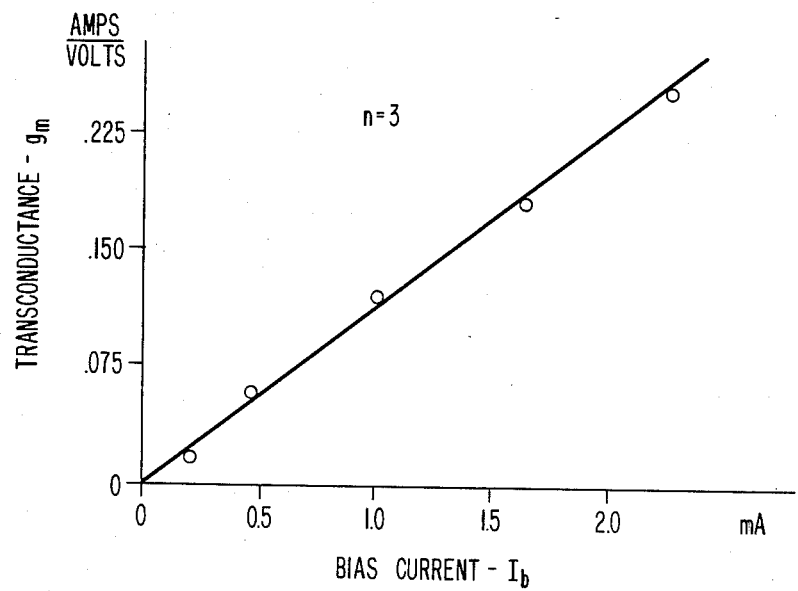
FIG. 4 is a transconductance control characteristic.

As shown in FIG. 4, the transconductance control characteristic $g_m$ vs. $I_b$ for the transistor 16 is linear over a range wherein the logarithmic V-I relationship is valid. This range of linearity typically includes several orders of bias current magnitude. Outside of that range, the control characteristic is smooth but not linear. The characteristic shown in FIG. 4 is for a circuit in accordance with FIG. 2 wherein the ratio of emitter areas n=3.

Transconductance is nearly independent of frequency up to the extrapolated unity-gain frequency, $f_T$, of the transistor 16. In silicon bipolar transistors, $f_T$ may be several gigahertz. To the extent that transconductance alone controls the frequency response of the amplifier, the amplifier may be made to have a bandwidth approaching the frequency $f_T$. Other factors which limit the response of the amplifier are a drop in beta of the transistor 16 at high frequencies and unwanted signal currents in parasitic capacitances.

The drop in beta at high frequencies is dealt with in the present circuit by the connection of the transistor 15 as a voltage-follower. The input impedance of the transistor 15 is approximately beta times the input impedance of the common-emitter transistor 16. Thus the input impedance of the transistor 15 may be made large relative to the source resistance 22 over a far wider range of frequencies than is possible for the input impedance of the common-emitter transistor alone.

Except for device size as mentioned previously and their conductivity types, the transistors 15, 16 and 17 have similar operating characteristics. There are known processes for fabricating the opposite conductivity type transistors having similar operating characteristics over extensive ranges of frequency and temperature. Such processes are described in an abandoned U.S. patent application, Ser. No. 658,586, filed on Feb. 17, 1976 in the names of W. E. Beadle, S. F. Moyer and A. A. Yiannoulos and in applicant's U.S. patent application, Ser. No. 337,707, filed Jan. 7, 1982.

Figure 3:
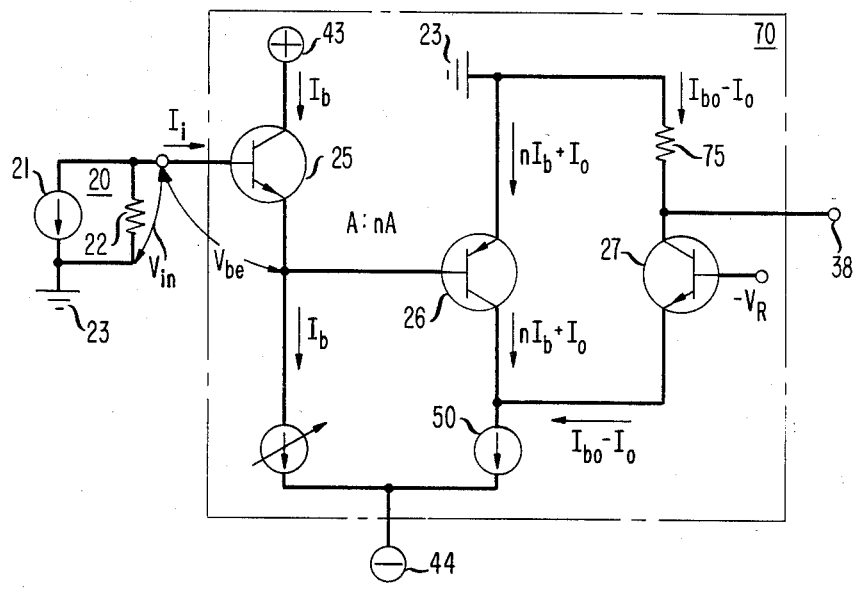
FIG. 3 is a schematic diagram of another portion of the circuit shown in FIG. 1.

Referring now to FIG. 3, there is shown a signal amplifying circuit 70 that is similar to the signal amplifying circuit 60 except for the following differences. The input transistor 25, which is arranged in the common-collector configuration, is an NPN transistor. Bias current $I_b$ is conducted from a positive polarity source 43 through the collector-emitter path and a bias current source 48 to a negative potential source 44. The transistor 26, which is arranged in a common-emitter configuration, is a PNP transistor. Bias current $nI_b$ for the transistor 26 is conducted from the ground reference 23 through the emitter-collector path of the transistor 26 and a current source 50 to the negative polarity source 44. The base-emitter junction of the output transistor 27 is connected as a load between the collector of the transistor 26 and a reference voltage $-V_R$. As shown symbolically, the cross-sectional emitter area nA of the common-emitter connected transistor 26 is n times the cross-sectional emitter area A of the input transistor 25. The output transistor 27, which is arranged in a common-base configuration, is an NPN transistor. Bias current $I_{bo}$ for the output transistor 27 is conducted from the ground reference potential 23 through a load 75, the collector-emitter path of the transistor 27 and the bias current source 50 to the negative polarity source 44. The cascode circuit arrangement of the transistors 26 and 27 is similar to the arrangement of the transistors 16 and 17 of the circuit 60 in FIG. 2 except for the polarity differences.

Except for the previously mentioned size differences between the transistors 25 and 26 and except for polarity differences caused by their conductivity types, the transistors 25, 26 and 27 have similar parameters and operating characteristics.

Upon inspection one finds that the three transistors 25, 26 and 27 in circuit 70 are opposite conductivity type counterparts, respectively, for the transistors 15, 16 and 17 in the circuit 60.

In operation the amplifier circuit 70 performs like the circuit 60 except for the changes of polarity. Transconductance $g_m$ of the transistor 26 is determined by the bias current $I_b$ conducted through the emitter of the input transistor 25. A smooth transconductance characteristic for the transistor 26 is produced over a very wide frequency range.

Referring once again to FIG. 1, the linear amplifier circuit 10 is similar to a combination of the circuits 60 and 70, respectively, of FIGS. 2 and 3. When combined the circuits 11 and 12 receive input signals in common, at the base electrodes of the input transistors 15 and 25. A single load 35 is connected in common to the collector electrodes of the output transistors 17 and 27.

The input transistors 15 and 25 are PNP and NPN conductivity types, respectively. Their base input electrodes are connected in common by way of a lead 51 to the source of input signals 20. Advantageously because of the common input connection 51 between the base electrodes of the opposite conductivity type input transistors 15 and 25, the bias currents $I_i$ to the respective base electrodes offset each other. An input node 55 at the base electrodes is virtually at a ground reference potential so that there is little or no input offset voltage. Whatever offset occurs results from differences in the characteristics of the transistors 15 and 25.

The common-emitter connected transistors 16 and 26 are NPN and PNP conductivity types, respectively. Their emitter electrodes are connected by way of a lead 52. The collector-emitter paths of the transistors 16 and 26 are connected in a series aiding circuit relationship. Advantageously because of the common connection 52 between the emitter electrodes of the transistors 16 and 26, their collector-emitter bias currents $nI_b$ offset each other. The transistors 15, 16, 25 and 26 should have identical characteristics except for conductivity types and their emitter area ratios should be equal. Then the bias current $nI_b$ conducted toward a node 54 by the transistor 16 will offset the bias current $nI_b$ connected away from the node 54 by the transistor 26. The node 54 in the lead 52 therefore is held at a virtual d.c. ground potential regardless of whether or not there is a finite load impedance 53 connected between the node 54 and the ground reference potential 23.

As shown, the output transistors 17 and 27 are PNP and NPN conductivity types, respectively. Collector electrodes of the transistors 17 and 27 are interconnected through a lead 56 and the load 35 to the ground reference 23. The collector-emitter paths of the transistors 17 and 27 are connected in a series aiding circuit relationship by way of the lead 56. The bias current $I_{bo}$ conducted toward a node 32 by the transistor 17 offsets the bias current $I_{bo}$ conducted away from the node 32 by the transistor 27. Thus the node 32 in the lead 56 is held at a virtual d.c. ground potential regardless of whether or not there is any impedance between the node 32 and the ground reference 23.

This implies that the load 35 may be coupled directly to the node 32 without interposed capacitance or inductance for separating the signal from the bias currents. The result is that the frequency response of the circuit 10 extends from d.c. to the highest capability of the transistors, which may extend to hundreds of megahertz. The output ground reference 23 is identical with that of the input without the coupling capacitor required in prior art circuits using a single conductivity type of transistor.

For input signals received at an input signal port at the node 55, there are two signal paths through the linear amplifier circuit 10 to an output signal port at the output terminal 38. One signal path is through the transistors 15, 16 and 17 to the terminal 38. The other signal path is through the transistors 25, 26 and 27 to the terminal 38.

The output currents of the circuits 11 and 12 and resulting from the input signal voltage $V_{in}$ are summed to the output signal current $2I_o$ in the load 35 so that the circuit 10 produces a transconductance $$g_m = \frac{2I_o}{V_{in}}.$$

This is double the magnitude of the output current of either circuit 11 or 12 operating independently. Thus the circuit 10 has twice the gain of either of the circuits 60 or 70 of FIGS. 2 and 3.

As previously mentioned, bias voltage is applied through bias ports which are designated as the sources 13, 14, 43 and 44 and as the ground reference 23.

Because of the pairing of the devices of the circuit 11 with counterpart opposite conductivity type devices in the circuit 12 and the resulting offsetting bias currents, the bias ports are isolated from the input signal port at the node 55 and the output signal port at the output terminal 38. Such isolation of the signal ports is achieved without the use of any inductors or capacitors. Therefore the circuit 10 can be fabricated readily as an integrated circuit.

Figure 5:
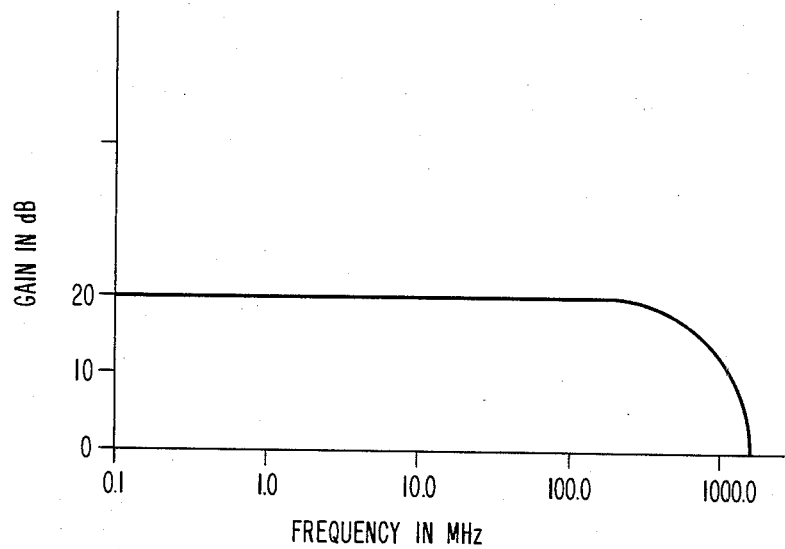
FIG. 5 is a frequency response characteristic.

Referring now to FIG. 5, there is shown a gain vs. frequency curve for the linear amplifier circuit 10 of FIG. 1. Because of the low source impedance, the high load impedance, the minimization of the Miller effect in the common-emitter configured transistors and the offsetting of bias currents in opposite conductivity type transistors, the linear amplifier circuit 10 of FIG. 1 has a smooth gain characteristic over a wide band of frequencies from near d.c. to hundreds of megahertz. When the bias currents $I_b$ conducted by the bias current sources 18 and 48 vary, the gain vs. frequency characteristic of the circuit 10 remains smooth over the wide range of frequencies.

The foregoing describes several embodiments of applicant's invention. Those embodiments together with others, which are obvious to those skilled in the art, are considered to be within the scope of the invention.

What is claimed is:

1. A linear amplifier circuit comprising
input and output signal ports;
a pair of signal amplifying circuits, each signal amplifying circuit being arranged for coupling an input signal from the input signal port to the output signal port;
means for connecting a bias supply to the signal amplifying circuits for supplying bias currents thereto;
means for isolating the input and output signal ports from the bias connecting means without capacitors or inductors;
a first signal amplifying circuit includes first, second and third transistors for transmitting signals from the input port through the first, second and third transistors in sequential order to the output port, the first and third transistors being of a first conductivity type and the second transistor being of an opposite conductivity type;
a second signal amplifying circuit includes fourth, fifth and sixth transistors for transmitting signals from the input port through the fourth, fifth and sixth transistors in sequential order to the output port, the fourth and sixth transistors being of the opposite conductivity type and the fifth transistor being of the first conductivity type;
the first and fourth transistors are arranged in common-collector circuit configurations;
the second and fifth transistors are arranged in common-emitter circuit configurations;
the third and sixth transistors are arranged in common-base circuit configurations;
the first and fourth transistors provide low source impedances, respectively, for the second and fifth transistors; and
the third and sixth transistors provide low load impedances, respectively, for the second and fifth transistors.

2. A linear amplifier circuit comprising
means for receiving input signals;
a first transistor of a first conductivity type arranged in a common-collector configuration;
a second transistor of a second conductivity type arranged in a common-emitter configuration;
a third transistor of the first conductivity type arranged in a common-base configuration;
means connecting the receiving means to an input of the first transistor for coupling input signals to the first transistor;
means connecting an output of the first transistor to an input of the second transistor for coupling signals to the second transistor;
means connecting an output of the second transistor to an input of the third transistor for coupling signals to the third transistor; and
means connect with an output of the third transistor for transmitting output signals.

3. A linear amplifier circuit in accordance with claim 2 further comprising
means interconnect emitter-collector paths of the second and third transistors in separate parallel branch circuits for conducting bias currents.

4. A linear amplifier circuit in accordance with claim 2 or 3 wherein
the first transistor is arranged to provide a low source impedance for the second transistor; and
the third transistor is arranged to provide a low load impedance for the second transistor.

5. A linear amplifier circuit comprising
input and output signal ports;
a pair of signal amplifying circuits, each signal amplifying circuit being arranged for coupling an input signal from the input signal port to the output signal port;
means for connecting a bias supply to the signal amplifying circuits for supplying bias currents thereto;
means for isolating the input and output signal ports from the bias connecting means without capacitors or inductors;
a first signal amplifying circuit includes first, second and third transistors for transmitting signals from the input port to the output port, the first and third transistors being of a first conductivity type and the second transistor being of an opposite conductivity type;
a second signal amplifying circuit includes fourth, fifth and sixth transistors for transmitting signals from the input port to the output port, the fourth and sixth transistors being of the opposite conductivity type and the fifth transistor being of the first conductivity type;
means interconnect the bases of the first and fourth transistors for interconnecting base-emitter junctions of the first and fourth transistors in a series aiding circuit relationship;
means interconnect the emitters of the second and fifth transistors in a first bias current branch circuit for conducting bias current through the collector-emitter paths of the second and fifth transistors in a series aiding circuit relationship;

means interconnect the collectors of the third and sixth transistors in a second bias current branch circuit for conducting bias current through the collector-emitter paths of the third and sixth transistors in a series aiding circuit relationship;

the first and fourth transistors are arranged in common-collector circuit configurations;

the second and fifth transistors are arranged in common-emitter circuit configurations;

the third and sixth transistors are arranged in common-base circuit configurations;

the first and fourth transistors provide low source impedances, respectively, for the second and fifth transistors; and the third and sixth transistors provide low load impedances, respectively, for the second and fifth transistors.

* * * * *